US012529967B2

(12) United States Patent
Akbas et al.

(10) Patent No.: US 12,529,967 B2
(45) Date of Patent: *Jan. 20, 2026

(54) METHOD TO MANUFACTURE NANO RIDGES IN HARD CERAMIC COATINGS

(71) Applicant: ASML Holding N.V., Veldhoven (NL)

(72) Inventors: Mehmet Ali Akbas, Cheshire, CT (US); Tammo Uitterdijk, Wilton, CT (US); Christopher John Mason, Newtown, CT (US); Matthew Lipson, Stamford, CT (US); David Hart Peterson, Milford, CT (US); Michael Perry, Thomaston, CT (US); Peter Helmus, New Milford, CT (US); Jerry Jianguo Deng, Ridgefield, CT (US); Damoon Sohrabibabaheidary, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/773,176

(22) Filed: Jul. 15, 2024

(65) Prior Publication Data
US 2024/0369947 A1 Nov. 7, 2024

Related U.S. Application Data
(63) Continuation of application No. 17/291,086, filed as application No. PCT/EP2019/078691 on Oct. 22, 2019, now Pat. No. 12,111,581.
(Continued)

(51) Int. Cl.
G03F 7/00 (2006.01)
H01L 21/687 (2006.01)

(52) U.S. Cl.
CPC .......... *G03F 7/707* (2013.01); *G03F 7/70491* (2013.01); *H01L 21/6875* (2013.01)

(58) Field of Classification Search
CPC ... G03F 7/707; G03F 7/70491; H01L 21/6875
See application file for complete search history.

(56) References Cited

U.S. PATENT DOCUMENTS 5,229,872 A 7/1993 Mumola
5,605,574 A * 2/1997 Tsunashima ............ C30B 31/14
118/728
(Continued)

FOREIGN PATENT DOCUMENTS

CN 1832852 A 9/2006
WO WO 2007/145505 A1 12/2007

OTHER PUBLICATIONS

International Search Report and Written Opinion of the International Searching Authority directed to related International Patent Application No. PCT/EP2019/078691, mailed Jan. 30, 2020; 11 pages.

*Primary Examiner* — Mathieu D Vargot
(74) *Attorney, Agent, or Firm* — Sterne, Kessler, Goldstein & Fox P.L.L.C.

(57) ABSTRACT

A method for reducing sticking of an object to a surface used in a lithography process includes receiving, at a control computer, instructions for a tool configured to modify the surface and forming, in a deterministic manner based on the instructions received at the control computer, a modified surface having a furrow and a ridge, wherein the ridge reduces the sticking by reducing a contact surface area of the modified surface. Another apparatus includes a modified surface that includes furrows and ridges forming a reduced contact surface area to reduce a sticking of an object to the modified surface, the ridges having an elastic property that
(Continued)

causes the reduced contact surface area to increase when the plurality of ridges is elastically deformed.

14 Claims, 17 Drawing Sheets

Related U.S. Application Data

(60) Provisional application No. 62/755,786, filed on Nov. 5, 2018.

(56) References Cited

U.S. PATENT DOCUMENTS

| | | | |
|---|---|---|---|
| 6,033,480 A | 3/2000 | Chen et al. | |
| 6,046,792 A | 4/2000 | Van Der Werf et al. | |
| 6,454,863 B1 | 9/2002 | Halpin | |
| 7,587,704 B2 | 9/2009 | Ye et al. | |
| 8,236,407 B2 | 8/2012 | Pricone | |
| 12,111,581 B2 * | 10/2024 | Akbas | G03F 7/70491 |
| 2001/0051264 A1 | 12/2001 | Mazurek et al. | |
| 2004/0046281 A1 | 3/2004 | Kim et al. | |
| 2005/0284372 A1 | 12/2005 | Murugesh et al. | |
| 2007/0031745 A1 | 2/2007 | Ye et al. | |
| 2007/0050749 A1 | 3/2007 | Ye et al. | |
| 2007/0114401 A1 | 5/2007 | King et al. | |
| 2008/0158538 A1 | 7/2008 | Puyt et al. | |
| 2008/0301620 A1 | 12/2008 | Ye et al. | |
| 2008/0309897 A1 | 12/2008 | Wong et al. | |
| 2009/0157630 A1 | 6/2009 | Yuan | |
| 2010/0162197 A1 | 6/2010 | Ye et al. | |
| 2010/0180251 A1 | 7/2010 | Ye et al. | |
| 2015/0348817 A1 | 12/2015 | Bodner et al. | |
| 2018/0122684 A1 | 5/2018 | Gratrix | |
| 2021/0405539 A1 | 12/2021 | Akbas et al. | |

* cited by examiner

METHOD TO MANUFACTURE NANO RIDGES IN HARD CERAMIC COATINGS

CROSS-REFERENCE TO RELATED APPLICATIONS

This application is a continuation of U.S. application Ser. No. 17/291,086, which was filed on May 4, 2021, now U.S. Pat. No. 12,111,581, which is a National Stage Entry of PCT/EP2019/078691, which has a 371(c) date of Oct. 22, 2019, which claims priority of U.S. Provisional Patent Application No. 62/755,786, which was filed on Nov. 5, 2018, and which is incorporated herein in its entirety by reference.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus may also be referred to as a stepper. In an alternative apparatus, a step-and-scan apparatus can cause a projection beam to scan over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices can be found in, for example, U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend referred to as "Moore's law." At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is can be referred to as low-k1 lithography, according to the resolution formula $CD=k1\times\lambda/NA$, where $\lambda$ is the wavelength of radiation employed (e.g., 248 nm or 193 nm), NA is the numerical aperture of projection optics in the lithographic projection apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

In one aspect, a method for reducing sticking of an object to a surface used in a lithography process includes receiving, at a control computer, instructions for a tool configured to modify the surface and forming, in a deterministic manner based on the instructions received at the control computer, a modified surface having a furrow and a ridge, wherein the ridge reduces the sticking by reducing a contact surface area of the modified surface.

In some variations, the modified surface can result from moving a tool tip of a tool causing a plastic deformation of the surface such that there is substantially no loss of material. The method can further include acquiring images of the surface from an imaging device, registering a tool tip in a coordinate space of the surface based on the images, and controlling the tool to move the tool tip to predefined coordinates in the coordinate space to create the furrow and the ridge. The controlling can have a horizontal resolution of 1 micron or less and a vertical resolution of 10 nanometers or less, and wherein the resolution of the delivered force by the tool tip is 1 mili-Newton or less. The controlling can also include controlling the tool tip to form the modified surface having a plurality of parallel ridges or controlling the tool tip to form the modified surface having a non-uniform density of ridges that corresponds to a non-uniform burl load. The surface can be at between 15 and 40 degrees Celsius when forming the modified surface.

Furthermore, there can be a computer program product comprising a non-transitory computer readable medium having instructions recorded thereon, the instructions when executed by a computer implementing the methods listed above.

In an interrelated aspect, an apparatus for use in a lithography process includes a modified surface that comprises of furrows and ridges forming a reduced contact surface area to reduce a sticking of an object to the modified surface, wherein at least 60% of the ridges have a height variation of less than 100 nm. The ridges can have a ridge height that is measured from an average height of an unmodified surface. At least 80% of the ridges can have a height variation of less than 100 nm, at least 60% of the ridges can have a height variation of less than 10 nm, or at least 80% of the ridges can have a height variation of less than 5 nm. The height variation can be measured over essentially all of the modified surface.

The apparatus can have a number of burls, the burls including the furrows and ridges on corresponding burl surfaces. At least some of the plurality of burls can have a coating, wherein the furrows and ridges are formed in the coating. The furrows and ridges can be parallel and can include hilltops, where the furrows and ridges are formed across the hilltops. The furrows and ridges can be formed substantially perpendicular to the hilltops.

The modified surface can be on a burl extending from a substrate. The substrate can be a reticle clamp, wafer clamp, or wafer table. The burl can further include a coating and the modified surface can be on the coating. The coating can be a hard ceramic coating and the surface can be a burl surface made from a number of burls.

The burl can include a hilltop and the furrow and ridge are formed at an oblique angle to the hilltop. The oblique angle can be approximately 90 degrees. The modified surface can include the furrow and two ridges on either side of the furrow. The furrow can have a depth between 50 to 150 nm, or a depth of approximately 100 nm. The ridge has a height between 2 and 50 nm or approximately 10 nm.

In an interrelated aspect, an apparatus can include a modified surface that includes furrows and ridges forming a reduced contact surface area to reduce a sticking of an object to the modified surface, the ridges having an elastic property that causes the reduced contact surface area to increase when the plurality of ridges is elastically deformed.

In some variations, the modified surface can be formed from a plurality of plastic deformations of an unmodified surface. The reduced contact surface area of the plurality of ridges can be less than 5% of a total contact surface area when no deforming forces are applied to the plurality of ridges. The reduced contact surface area can increase to greater than 25% of the total surface area defined by outermost ridges when a downward clamping pressure of at least 0.5 Bar is applied to a portion of the object.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

Figure 1:
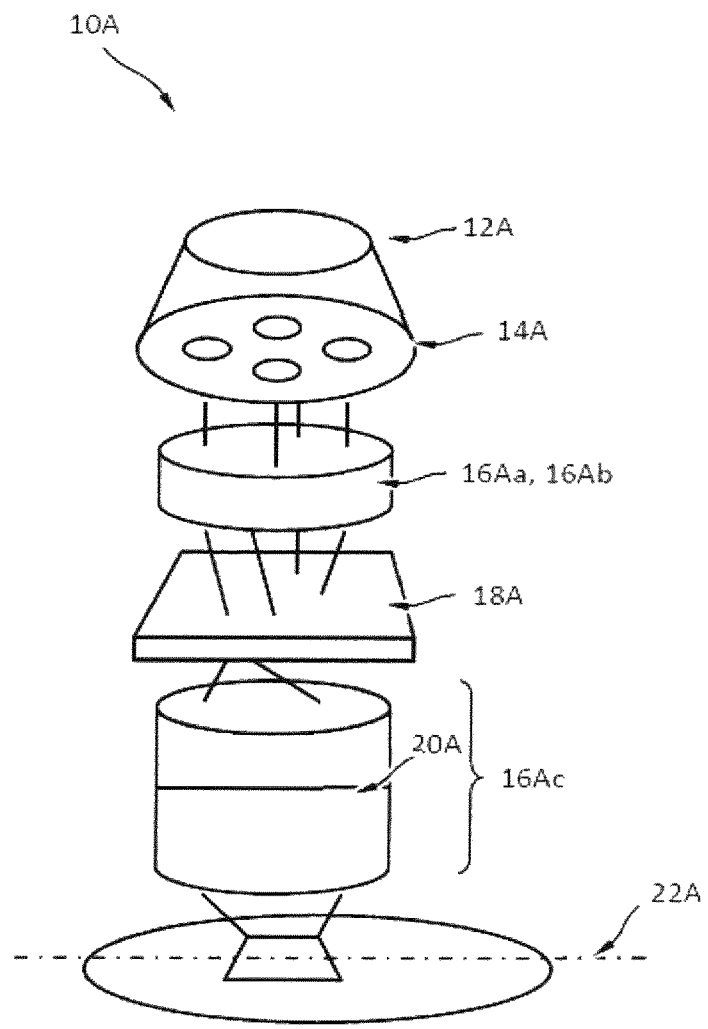
FIG. 1 illustrates a block diagram of various subsystems of a lithographic projection apparatus, according to an embodiment.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include a programmable mirror array and a programmable LCD array.

An example of a programmable mirror array can be a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic methods.

An example of a programmable LCD array is given in U.S. Pat. No. 5,229,872, which is incorporated herein by reference.

FIG. 1 illustrates a block diagram of various subsystems of a lithographic projection apparatus 10A, according to an embodiment. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin $(\Theta_{max})$, wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist model can be used to calculate the resist image from the aerial image, an example of which can be found in U.S. Patent Application Publication No. US 2009-0157630, the disclosure of which is hereby incorporated by reference in its entirety. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety.

One aspect of understanding a lithographic process is understanding the interaction of the radiation and the patterning device. The electromagnetic field of the radiation after the radiation passes the patterning device may be determined from the electromagnetic field of the radiation before the radiation reaches the patterning device and a function that characterizes the interaction. This function may be referred to as the mask transmission function (which can be used to describe the interaction by a transmissive patterning device and/or a reflective patterning device).

The mask transmission function may have a variety of different forms. One form is binary. A binary mask transmission function has either of two values (e.g., zero and a positive constant) at any given location on the patterning device. A mask transmission function in the binary form may be referred to as a binary mask. Another form is continuous. Namely, the modulus of the transmittance (or reflectance) of the patterning device is a continuous function of the location on the patterning device. The phase of the transmittance (or reflectance) may also be a continuous function of the location on the patterning device. A mask transmission function in the continuous form may be referred to as a continuous tone mask or a continuous transmission mask (CTM). For example, the CTM may be represented as a pixelated image, where each pixel may be assigned a value between 0 and 1 (e.g., 0.1, 0.2, 0.3, etc.) instead of binary value of either 0 or 1. In an embodiment, CTM may be a pixelated gray scale image, where each pixel having values (e.g., within a range [−255, 255], normalized values within a range [0, 1] or [−1, 1] or other appropriate ranges).

The thin-mask approximation, also called the Kirchhoff boundary condition, is widely used to simplify the determination of the interaction of the radiation and the patterning device. The thin-mask approximation assumes that the thickness of the structures on the patterning device is very small compared with the wavelength and that the widths of the structures on the mask are very large compared with the wavelength. Therefore, the thin-mask approximation assumes the electromagnetic field after the patterning device is the multiplication of the incident electromagnetic field with the mask transmission function. However, as lithographic processes use radiation of shorter and shorter wavelengths, and the structures on the patterning device become smaller and smaller, the assumption of the thin-mask approximation can break down. For example, interaction of the radiation with the structures (e.g., edges between the top surface and a sidewall) because of their finite thicknesses ("mask 3D effect" or "M3D") may become significant. Encompassing this scattering in the mask transmission function may enable the mask transmission function to better capture the interaction of the radiation with the patterning device. A mask transmission function under the thin-mask approximation may be referred to as a thin-mask transmission function. A mask transmission function encompassing M3D may be referred to as a M3D mask transmission function.

According to an embodiment of the present disclosure, one or more images may be generated. The images includes various types of signal that may be characterized by pixel values or intensity values of each pixel. Depending on the relative values of the pixel within the image, the signal may be referred as, for example, a weak signal or a strong signal, as may be understood by a person of ordinary skill in the art. The term "strong" and "weak" are relative terms based on intensity values of pixels within an image and specific values of intensity may not limit scope of the present disclosure. In an embodiment, the strong and weak signal may be identified based on a selected threshold value. In an embodiment, the threshold value may be fixed (e.g., a midpoint of a highest intensity and a lowest intensity of pixel within the image. In an embodiment, a strong signal may refer to a signal with values greater than or equal to an average signal value across the image and a weak signal may refer to signal with values less than the average signal value. In an embodiment, the relative intensity value may be based on percentage. For example, the weak signal may be signal having intensity less than 50% of the highest intensity of the pixel (e.g., pixels corresponding to target pattern may be considered pixels with highest intensity) within the image. Furthermore, each pixel within an image may considered as a variable. According to the present embodiment, derivatives or partial derivative may be determined with respect to each pixel within the image and the values of each pixel may be determined or modified according to a cost function based evaluation and/or gradient based computation of the cost function. For example, a CTM image may include pixels, where each pixel is a variable that can take any real value.

Figure 2:
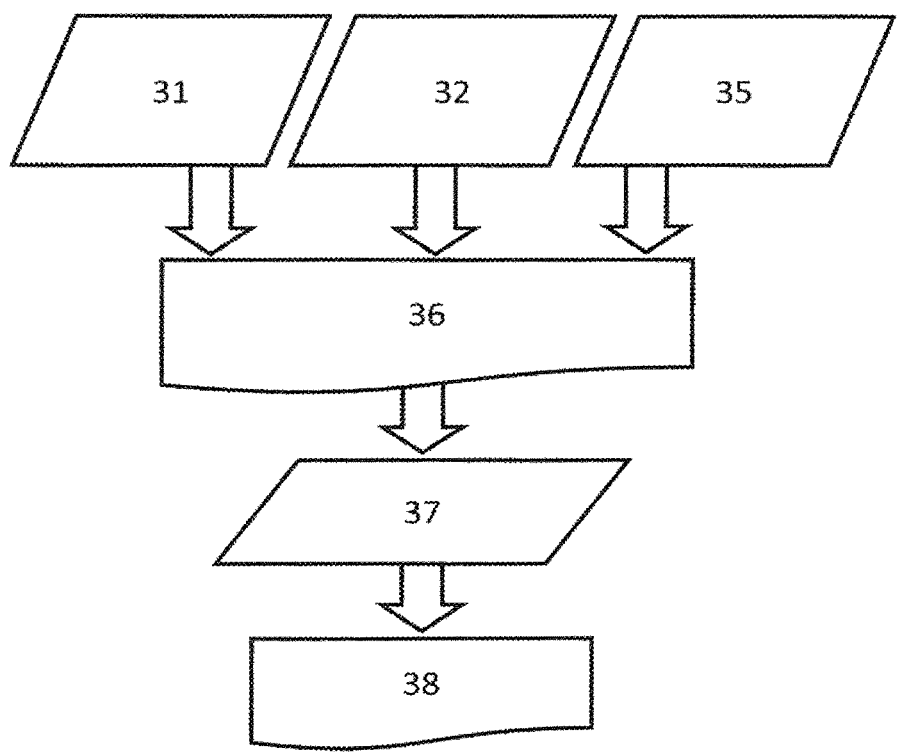
FIG. 2 illustrates an exemplary flow chart for simulating lithography in a lithographic projection apparatus, according to an embodiment.

FIG. 2 illustrates an exemplary flow chart for simulating lithography in a lithographic projection apparatus, according to an embodiment. Source model 31 represents optical characteristics (including radiation intensity distribution and/or phase distribution) of the source. Projection optics model 32 represents optical characteristics (including changes to the radiation intensity distribution and/or the phase distribution caused by the projection optics) of the projection optics. Design layout model 35 represents optical characteristics of a design layout (including changes to the radiation intensity distribution and/or the phase distribution caused by design layout 33), which is the representation of an arrangement of features on or formed by a patterning device. Aerial image 36 can be simulated from design layout model 35, projection optics model 32, and design layout model 35. Resist image 38 can be simulated from aerial image 36 using resist model 37. Simulation of lithography can, for example, predict contours and CDs in the resist image.

More specifically, it is noted that source model 31 can represent the optical characteristics of the source that include, but not limited to, numerical aperture settings, illumination sigma (σ) settings as well as any particular illumination shape (e.g. off-axis radiation sources such as annular, quadrupole, dipole, etc.). Projection optics model 32 can represent the optical characteristics of the projection optics, including aberration, distortion, one or more refractive indexes, one or more physical sizes, one or more physical dimensions, etc. Design layout model 35 can represent one or more physical properties of a physical patterning device, as described, for example, in U.S. Pat. No. 7,587,704, which is incorporated by reference in its entirety. The objective of the simulation is to accurately predict, for example, edge placement, aerial image intensity slope and/or CD, which can then be compared against an intended design. The intended design is generally defined as a pre-OPC design layout which can be provided in a standardized digital file format such as GDSII or OASIS or other file format.

From this design layout, one or more portions may be identified, which are referred to as "clips". In an embodiment, a set of clips is extracted, which represents the complicated patterns in the design layout (typically about 50 to 1000 clips, although any number of clips may be used). These patterns or clips represent small portions (i.e. circuits, cells or patterns) of the design and more specifically, the clips typically represent small portions for which particular attention and/or verification is needed. In other words, clips may be the portions of the design layout, or may be similar or have a similar behavior of portions of the design layout, where one or more critical features are identified either by experience (including clips provided by a customer), by trial and error, or by running a full-chip simulation. Clips may contain one or more test patterns or gauge patterns.

An initial larger set of clips may be provided a priori by a customer based on one or more known critical feature areas in a design layout which require particular image optimization. Alternatively, in another embodiment, an initial larger set of clips may be extracted from the entire design layout by using some kind of automated (such as machine vision) or manual algorithm that identifies the one or more critical feature areas.

In a lithographic projection apparatus, as an example, a cost function may be expressed as $$CF(z_1, z_2, \ldots, z_N) = \sum_{p=1}^{P} w_p f_p^2(z_1, z_2, \ldots, z_N) \quad \text{(Eq. 1)}$$

where $(z_1, z_2, \ldots, z_N)$ are N design variables or values thereof. $f_p(z_1, z_2, \ldots, z_N)$ can be a function of the design variables $(z_1, z_2, \ldots, z_N)$ such as a difference between an actual value and an intended value of a characteristic for a set of values of the design variables of $(z_1, z_2, \ldots, z_N)$. $w_p$ is a weight constant associated with $f_p(z_1, z_2, \ldots, z_N)$. For example, the characteristic may be a position of an edge of a pattern, measured at a given point on the edge. Different $f_p(z_1, z_2, \ldots, z_N)$ may have different weight $w_p$. For example, if a particular edge has a narrow range of permitted positions, the weight $w_p$ for the $f_p(z_1, z_2, \ldots, z_N)$ representing the difference between the actual position and the intended position of the edge may be given a higher value. $f_p(z_1, z_2, \ldots, z_N)$ can also be a function of an interlayer characteristic, which is in turn a function of the design variables $(z_1, z_2, \ldots, z_N)$. Of course, $CF(z_1, z_2, \ldots, z_N)$ is not limited to the form in Eq. 1. $CF(z_1, z_2, \ldots, z_N)$ can be in any other suitable form.

The cost function may represent any one or more suitable characteristics of the lithographic projection apparatus, lithographic process or the substrate, for instance, focus, CD, image shift, image distortion, image rotation, stochastic variation, throughput, local CD variation, process window, an interlayer characteristic, or a combination thereof. In one embodiment, the design variables $(z_1, z_2, \ldots, z_N)$ comprise one or more selected from dose, global bias of the patterning device, and/or shape of illumination. Since it is the resist image that often dictates the pattern on a substrate, the cost function may include a function that represents one or more characteristics of the resist image. For example, $f_p(z_1, z_2, \ldots, z_N)$ can be simply a distance between a point in the resist image to an intended position of that point (i.e., edge placement error $EPE_p(z_1, z_2, \ldots, z_N)$. The design variables can include any adjustable parameter such as an adjustable parameter of the source, the patterning device, the projection optics, dose, focus, etc.

The lithographic apparatus may include components collectively called a "wavefront manipulator" that can be used to adjust the shape of a wavefront and intensity distribution and/or phase shift of a radiation beam. In an embodiment, the lithographic apparatus can adjust a wavefront and intensity distribution at any location along an optical path of the lithographic projection apparatus, such as before the patterning device, near a pupil plane, near an image plane, and/or near a focal plane. The wavefront manipulator can be used to correct or compensate for certain distortions of the wavefront and intensity distribution and/or phase shift caused by, for example, the source, the patterning device, temperature variation in the lithographic projection apparatus, thermal expansion of components of the lithographic projection apparatus, etc. Adjusting the wavefront and intensity distribution and/or phase shift can change values of the characteristics represented by the cost function. Such changes can be simulated from a model or actually measured. The design variables can include parameters of the wavefront manipulator.

The design variables may have constraints, which can be expressed as $(z_1, z_2, \ldots, z_N) \in Z$, where Z is a set of possible values of the design variables. One possible constraint on the design variables may be imposed by a desired throughput of the lithographic projection apparatus. Without such a constraint imposed by the desired throughput, the optimization may yield a set of values of the design variables that are unrealistic. For example, if the dose is a design variable, without such a constraint, the optimization may yield a dose value that makes the throughput economically impossible. However, the usefulness of constraints should not be interpreted as a necessity. For example, the throughput may be affected by the pupil fill ratio. For some illumination designs, a low pupil fill ratio may discard radiation, leading to lower throughput. Throughput may also be affected by the resist chemistry. Slower resist (e.g., a resist that requires higher amount of radiation to be properly exposed) leads to lower throughput.

As used herein, the term "patterning process" means a process that creates an etched substrate by the application of specified patterns of light as part of a lithography process.

As used herein, the term "imaging device" means any number or combination of devices and associated computer hardware and software that can be configured to generate images of a target, such as the printed pattern or portions thereof, or of any surfaces and features as described throughout the specification. Non-limiting examples of an imaging devices can include: scanning electron microscopes (SEMs), atomic force microscopes (AFMs), x-ray machines, optical microscopes, etc.

Some lithography processes include, for example, using a reticle (or mask) to provide a specific pattern of light at a photoresist to create a pattern for etching onto a wafer. To hold the reticle and wafer in place, clamping devices can be used. Because it is important to the manufacturing process that the surfaces involved be very flat, an undesirable consequence can be that reticle can stick to the reticle clamp, the wafer can stick to the wafer clamp or wafer table where the wafer rests, etc. This sticking can cause damage to the wafer, reticle, clamps, etc. The sticking mechanism can include the forming of van der Waals bonds between the components along the contact surfaces. Accordingly, embodiments of the disclosed subject matter address the problem of sticking by, among other things, reducing the total van der Waals forces between the objects by, for example, reducing the contact area between components, thus making sticking less likely to occur. The reduced contact area can be formed in a deterministic manner by the controlled formation of ridges on surfaces of interest (e.g., wafer table tops, clamps, etc.)

Figure 3:
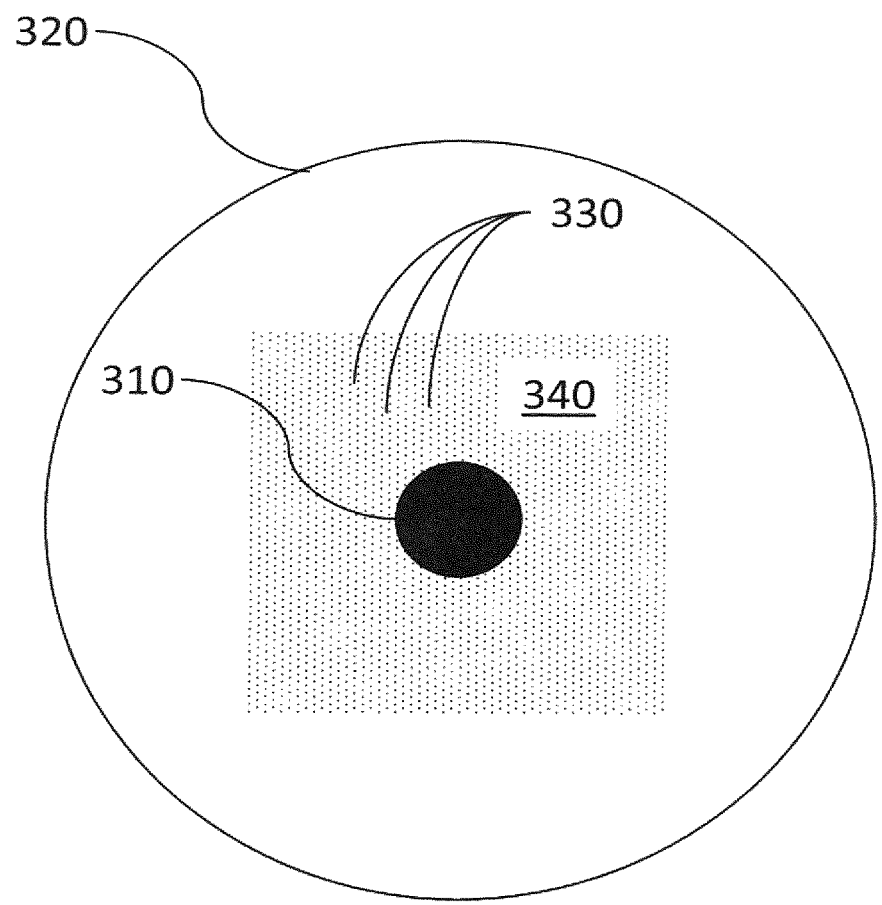
FIG. 3 is a simplified top view of a wafer resting upon a burl surface of a wafer table, according to an embodiment.

FIG. 3 illustrates a simplified top view of a wafer 310 resting upon a burl surface 340 of a wafer table 320, according to an embodiment.

Wafer table 320 is shown with a number of burls 330 that combine to form burl surface 340. An example wafer 310 can rest upon burl surface 340. As illustrated further in FIG. 4, burls, as used herein, can include any material features that extend from a substrate, such as a wafer table 320, wafer clamp, reticle clamp, etc. to support a wafer 310 or reticle.

Burls can provide some nominal separation (and reduction of contact surface area) between wafer 310 and wafer table 320. For example, by supporting wafer 310 on burl surface 340 (which can be made up of a number of burls 330 having some separation between them), the above-described van der Waals forces can be reduced as well as the avoidance of vacuums, air pockets, etc.

The embodiments described herein generally refer to a wafer resting upon wafer table. However, such description is not intended to be limiting. For example, rather than wafers and wafer tables, aspects of the present disclosure can also be applied to other components (e.g., reticles in contact with reticle clamps), as well as the wafer resting on burls of any type, number, and geometry having an associated burl surface.

Figure 4:
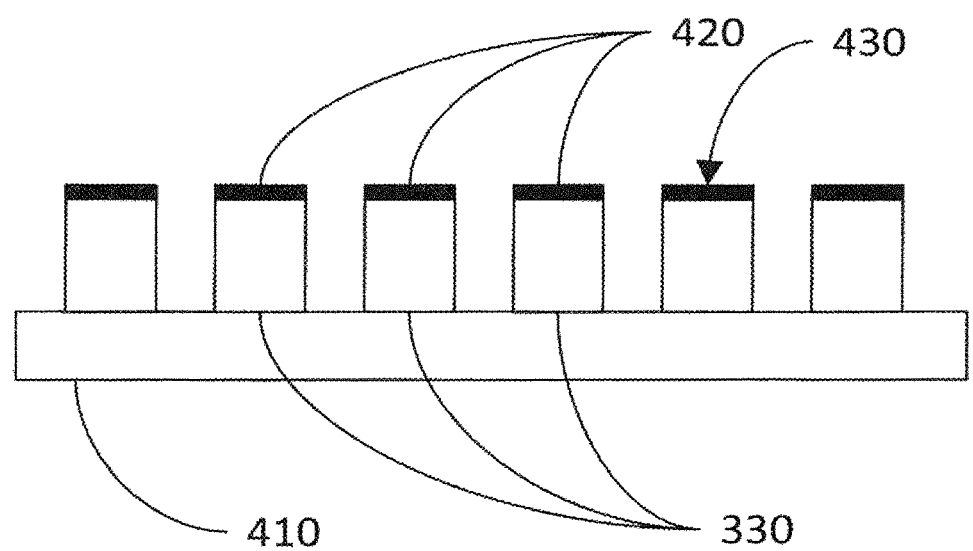
FIG. 4 is a simplified side view of burls with coatings, according to an embodiment.

FIG. 4 illustrates a simplified side view of burls 330 with coatings 420, according to an embodiment.

The side view illustrated in FIG. 4, shows a number of exemplary burls 330 extending from substrate 410. In some embodiments, as shown, burls 330 can include a coating 420, which may be a hard ceramic coating, provided on at least a top surface of the burls 330. Coatings 420 can include, for example, Titanium Nitride (TiN), Chromium Nitride (CrN), Diamond-like Carbon (DLC), Tantalum (Ta), Tantalum Boride (TaB), Tungsten (W), Tungsten Carbide (WC), Boron Nitride (BN), etc. Such coatings can be added to burls 330 to protect the burl structure underneath. As used herein, the term "burl surface 430" can refer to either a top surface of a burl 330 when there is no coating 420, or to a top surface of coating 420 when such coating 420 is present on burl 330.

Figure 5:
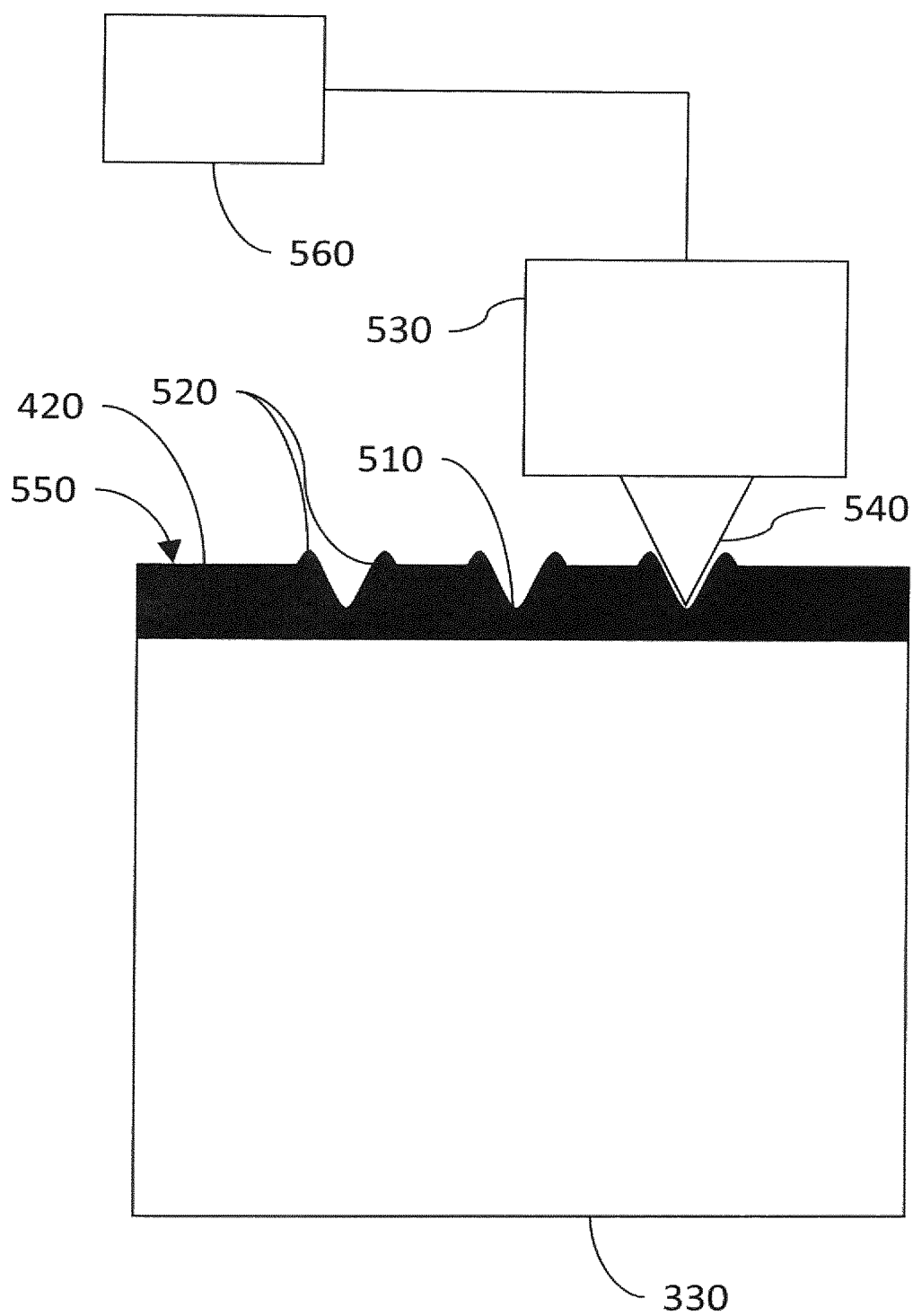
FIG. 5 illustrates a simplified side view of a burl having several exemplary ridges and furrows formed by a tool, according to an embodiment.
Figure 6:
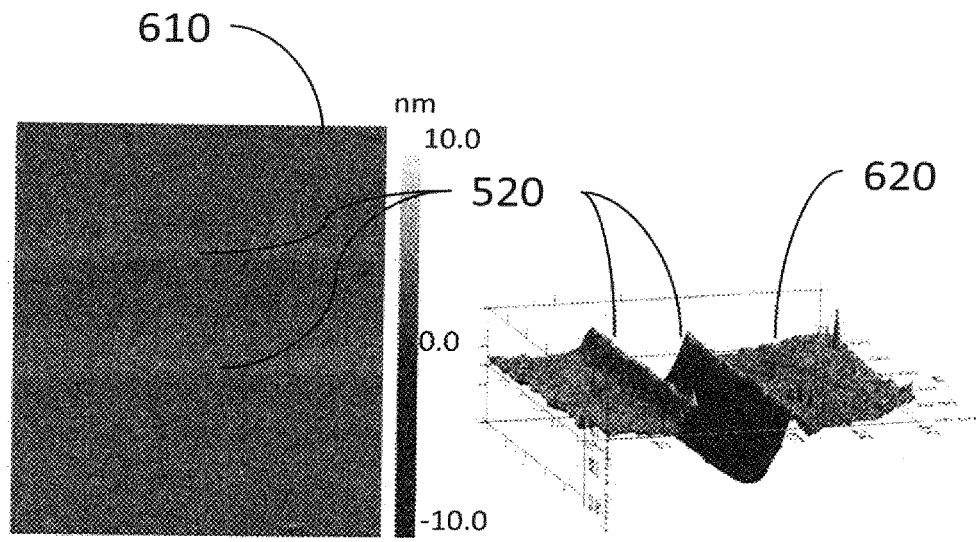
FIG. 6 illustrates an exemplary image of a furrow and ridges, according to an embodiment.
Figure 6:
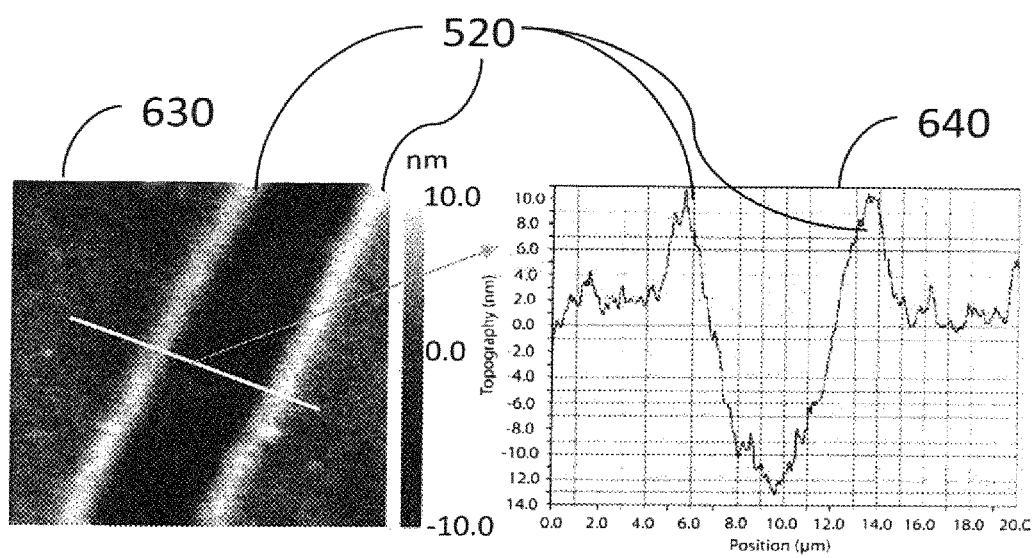

FIG. 5 illustrates a simplified side view of burl 330 having several exemplary ridges 520 and furrows 510 formed by a tool 530, according to an embodiment. FIG. 6 illustrates an exemplary image of a furrow and ridges 520, according to an embodiment.

One example result of a method for reducing sticking of an object at a surface used in a lithography process is shown in FIG. 5. The method can include receiving, at a control computer 560, instructions for a tool 530 configured to modify the surface, for example as shown in FIG. 5. As shown in FIG. 6, the modification can include forming, in a deterministic manner based on the instructions received at the control computer 560, modified surface 550 having furrow 510 and ridge 520.

In some implementations, tool 530 can be initially rested on the surface with a comparatively small initial force, for example, around 1 mN, 2 mN, 4 mN, or 10 mN, etc. to temporarily fix the tool tip in place on the surface. Vertical force can then be increased to a specified value to form an initial depression with tool 530. The vertical force can be, for example, around 10 mN, 20 mN, 40 mN, 75 mN, 100 mN, 150 mN, 200 mN, 500 mN, IN, etc. The vertical force of tool 530 can be held constant during horizontal travel performed during scratch formation. Computer control of tool 530 can include monitoring lateral and/or vertical force, as well as tool 530 displacement, during the scratching process. The programming of tool 530 location and applied force can be preprogrammed relative to known burl locations. In this way, the process can be fully automated and computer controlled to provide deterministic scratches on burl surfaces (or any other desired surface).

Returning to FIG. 5, ridge 520 can reduce sticking by reducing a contact surface area of the surface. As used herein "contact surface area" means the effective surface area that is in contact with an object placed upon the modified surface 550. For example, referring to example of FIG. 5, without the ridges 520 and furrows 510 shown, the contact surface area would be the entire top surface of the burl. After modifying the surface, the contact surface area would only be the tops of the ridges 520. This example is provided for illustrative purposes and not intended to be limiting or exclusive of other embodiments where the contact surface area is reduced by implementations of the present disclosure.

As shown in FIGS. 5 and 6, modified surface 550 can include furrow 510 and two ridges 520 on either side of furrow 510. In some embodiments, furrow 510 can have a depth between 5 to 150 nm, approximately 100 nm, etc. Ridge 520 can have a height between 2 and 50 nm, approximately 10 nm, etc. Measurements taken of modified surface 550 can, for example, be displayed as two-dimensional image 610, which can also be displayed three-dimensional plot 620, as shown in FIG. 6. In FIG. 6, topography map 630 and section height 640 (taken along the line crossing the furrow shown in topography map 630) illustrate the uniformity of the ridge height resulting from one example of the disclosed processes. As seen in the images, but by way of example only, the ridges are shown to be quite symmetrical and have nearly identical heights of about 10 nm.

The modified surface 550 described above is shown in many embodiments herein as being on a burl 330 (or any number of burls 330) extending from substrate 410, or equivalently, on coating 420 on burl 330. Also as illustrated in FIG. 5, in some embodiments, burl 330 can have coating 420 and modified surface 550 is on coating 420. In some embodiments, the substrate can be a reticle clamp, wafer clamp, or wafer table, or any other surface of any object capable of having the ridges described herein. In this way, the present disclosure contemplates that the surface that is modified can be any surface and not limited to burls, burl surfaces, ceramic coatings on burls, or the like. For example, the surface can be of a reticle clamp, wafer clamp, wafer table, etc. that has the ridges 520 formed directly upon the surface. Also, the methods described herein can allow for "room temperature" modification of the surface (e.g., without requiring any additional heating or cooling of the surface prior to modification). In some embodiments, the surface can be at between 15 and 40 degrees Celsius when forming modified surface 550.

FIG. 5 also illustrates one example method of forming ridges 520 in the modified surface 550 where as a result of moving a tool tip 540 of a tool 530 causing the plastic deformation of the surface. While the embodiments of furrows 510 and ridges 520 described herein are shown as being formed due to tool 530 being pressed down (e.g., in a generally vertical manner), the present disclosure contemplates that any equivalent application of forces to deform the surface can be applied. For example, tool tip 540 can optionally be pressed at an oblique angle (e.g. approximately 5°, 10°, 15°, 30°, 45°, 60°, 75°, etc.) from the vertical. While any type and size of tool tip 540 may be used, in some embodiments, tool tip 540 can be 5, 20, 50 or 100 micron radius diamond conical tool tips. Similar hard ceramics, metals or coatings can be used as tool tip material, examples include, but are not limited, to cubic boron nitride (BN), tungsten carbide (WC), titanium nitride (TiN), chromium nitride (CrN), tungsten (W), tantalum carbide (TaC), tantalum boride (TaB), diamond like carbon coatings (DLC) or various oxides such as $Al_2O_3$. Similarly, various tip geometries used to manufacture the ridges can include, but are not limited, to spherical, conical, Berkovich or cube corner types. Any one of these tip geometries can be used depending on a desired tip geometry.

In some embodiments, modified surface 550 can result from moving tool tip 540 causing a plastic deformation of the surface. As used herein, the term "plastic deformation" means modifying the surface such that there is substantially no loss of material. For example, plastic deformation is distinct from the type of surface modification that would result from for example sanding, stoning, digging, or the like, where material is removed from the surface and either lost or displaced elsewhere (in the form of particles, dust, granules, etc.).

Figure 7:
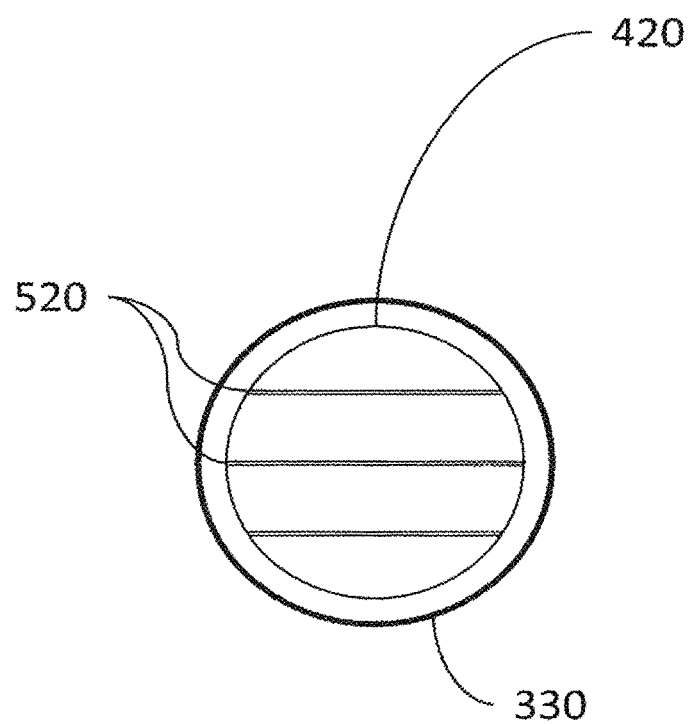
FIG. 7 illustrates a simplified top view of a burl having several exemplary ridges formed on the burl surface, according to an embodiment.

FIG. 7 illustrates a simplified top view of a burl having several exemplary ridges 520 formed on the burl surface, according to an embodiment.

In some embodiments described herein, the furrows and ridges 520 can be formed to specific predefined patterns. For example, as shown in FIG. 7, the furrows and ridges 520 can be parallel. This is illustrated in the example of ridges 520 formed on coating 420 of a burl 330, but such parallel ridge formation can be implemented on any desired surface.

Figure 8A:
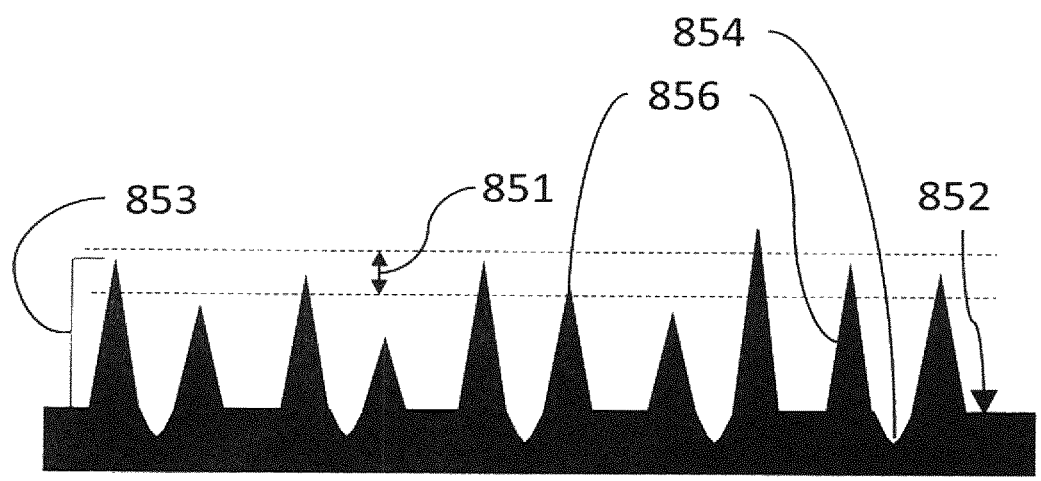
FIG. 8A is a simplified diagram illustrating a variation of ridge heights, according to an embodiment.

FIG. 8A is a simplified diagram illustrating a variation of ridge heights, according to an embodiment.

The methods described herein allow ridges to be formed with very little variation in ridge height, thus providing the benefit of reduced sticking while still providing a level surface. FIG. 8A shows a number of ridges 856 where most of the ridges have a height 853 that varies within a particular range 851. As illustrated by this example, there are 10 ridges formed on unmodified surface 852. Six of these ridges have ridge heights within range 851. Three of the ridges have heights below range 851 and one ridge has a height above range 851. Accordingly, in some embodiments, due to the precise computer control of the ridge-forming process, at least 60% of ridges that are positioned and configured to contact an object placed on the burls will have a height variation of less than 100 nm. In other words, at least 60% of the ridges (that will contact an object placed thereon) will have a height that falls within 100 nm of one another, as measured by the distances from peaks (top of the ridges) to the valleys between the burls (e.g., the unmodified surface 852 in FIG. 8A). The term "height variation," as used herein, is the variation between a minimum and maximum ridge height. The ridge height 853, as used herein, means the ridge height that as can be measured from an average height of unmodified surface 852.

In some implementations, the ridge height can be measured over the entire modified surface of a burled area, e.g., over the burls that form a burl top of a wafer table, reticle clamp, wafer clamp, etc. In this way, in an implementation, the height variation can be measured over essentially all of the modified surface. As used herein, "essentially all of the modified surface" means an entire burl top, but excepting areas that are not modified, for example, areas between burls, areas near the edges of a burl top that may not contain burls, areas that happen to be without burling or other surface modification, etc.). In other implementations, the ridge height (relative to the unmodified surface 852) can be measured over a smaller area, for example a circle corresponding to a wafer or a working area of a burl top. This can include, for example, a 200 to 500 micron diameter circle that may generally correspond to the size of some wafers.

The above numbers are examples only, and in some variations, the percentage of ridges having a height variation of less than 100 nm can be at least 70%, 75%, 80%, 85%, 90%, 95%, or 99%. In yet another variation, the percentage of ridges with the 100 nm height variation can also be 100%. Also, in another embodiment, the height variation can be less than 75 nm, 50 nm, 25 nm, 10 nm, 5 nm, 2.5 nm, 1 nm, or 0.5 nm, for each of the percentages above.

Measuring the ridge height can be performed by imaging the burl surface. Images of the burl surface can be acquired by, for example, white light interferometers, atomic force microscopes, scanning probe microscopes, etc. These images can be used to measure the ridge heights as illustrated, for example, in FIGS. 6 and 8A, and thus be used for refinement of the deterministic scratching process in later runs or as active feedback to reduce height variation.

Figure 8B:
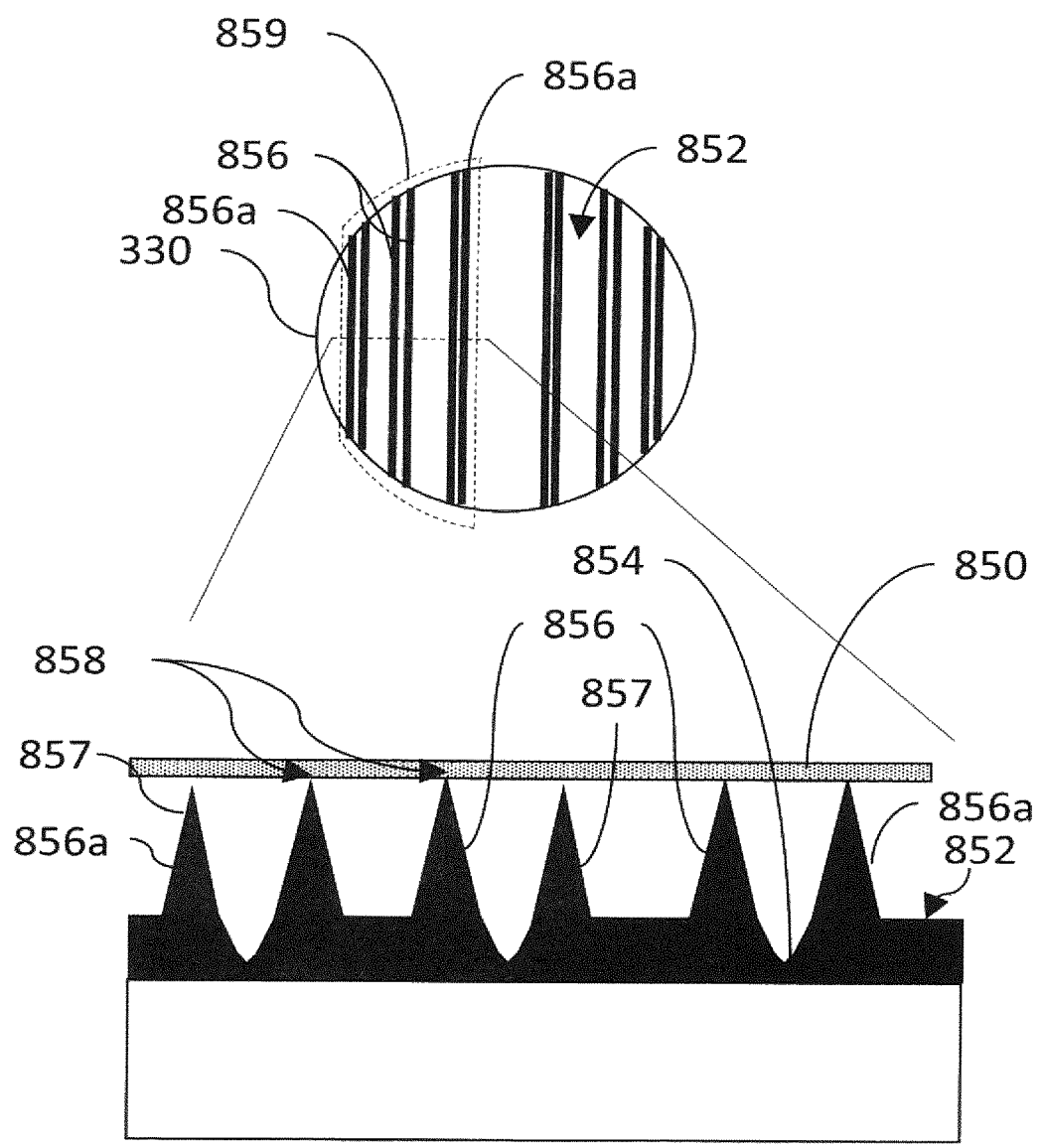
FIG. 8B is a simplified diagram illustrating uncompressed elastic ridges, according to an embodiment.

FIG. 8B is a simplified diagram illustrating uncompressed elastic ridges, according to an embodiment.

FIG. 8B illustrates a simplified example of a burl 330 having a number of (uncompressed) ridges 856 forming a modified surface, before compression is applied. In particular, FIG. 8B illustrates a top view and an example partial sectional view of burl 330, but including an additional example sectional view of an object 850 laying on ridges 856. Ridges 857 are shown to illustrate examples of ridges where the height of ridges 857 may be outside of a particular range of height variation. However, as previously described, various embodiments of the present disclosure contemplates different percentages of the formed ridges having less than a particular height variation.

Object 850 (e.g., a portion of a wafer) is shown laying on top of ridges 856 and having a reduced contact surface area 858 as a result of only coming into contact with a small portion (e.g., the tips) of the ridges. Because the ridges typically have small contact surface area of the top of the ridges, embodiments of the present disclosure can include modified surfaces where the reduced contact surface area of the ridges is less than 5% of a total contact surface area. One example of defining a total contact surface area is the area 859 (for illustrative purposes shown slightly larger than the actual size) encompassed by the outermost ridges 856a. In other words, in FIG. 8B, the outermost ridges 856a on a particular burl can define an area 859 occupied by the ridges that will contact the object 850 (given the allowed variation in ridge height) when no downward clamping force is applied to the object 850. As shown in the example of FIG. 8B, the contact surface area would be an area 859 that is significantly larger than the reduced contact surface area 858 at the contact points of the ridges. The burl tops 858 that contact the object 850 when no force is applied will occupy a surface area of less than 5% of the total surface area within that defined area. In other embodiments, the reduced contact surface area can be less than approximately 2% of a contact surface area.

As described herein, embodiments of the current subject matter allows the creation of surfaces with reduced sticking by effectively reducing the contact surface area between an object 850 (e.g. a wafer) and a surface (e.g., a burl surface of a wafer table). In some embodiments, for example where the furrows and ridges have been formed by plastic deformation of an unmodified surface by a tool, the ridges can be elastic and compressible. As shown in FIG. 8B, an apparatus consistent with the embodiments disclosed herein can include a modified surface that comprises furrows 854 and ridges 856 forming a reduced contact surface area 858 to reduce a sticking of an object 850 to the modified surface. The modified surface comprises a small section of a single burl top, having the plurality of ridges 856. The ridges can have an elastic property that can cause the reduced contact surface area to increase when the ridges are elastically deformed, for example, by the application of a downward force. For example, the (reduced) contact surface area 858 can increase (as shown below with reference to FIG. 8C) when the object compresses the ridges and more of the ridge comes into contact with an object, particularly one that is clamped thereon. This increase in the contact surface area can have the benefit of increasing friction between an object and the modified surface when desired (e.g. when the object is clamped to the modified surface). Conversely, when pressure between the object and the modified surface is removed (e.g., the object is unclamped), the ridges can elastically return to their normal shape where the contact surface area 858 is reduced and thus the object is less likely to stick to the modified surface.

Figure 8C:
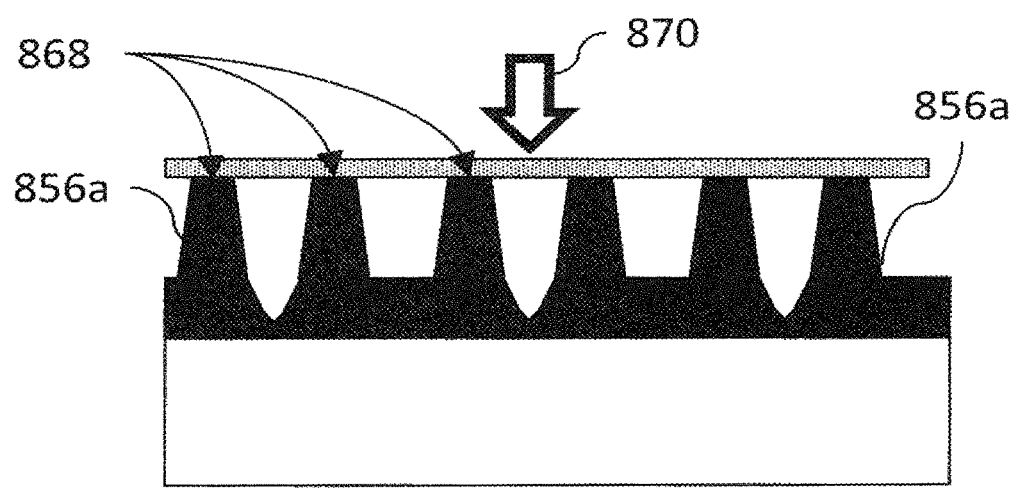
FIG. 8C is a simplified diagram illustrating compressed elastic ridges, according to an embodiment.

FIG. 8C is a simplified diagram illustrating compressed elastic ridges, according to an embodiment.

FIG. 8C illustrates one example of how ridges can elastically deform to cause an increase in the contact surface area. When an outside force 870 (e.g., a clamping force on the object) is applied to the object, the elastic properties of the ridges can allow a reversible compression of the ridges that has the effect of increasing the portions of the ridges in contact with the object. This can have the effect of increasing the "reduced contact surface area" (indicated by the arrows 868) over the case where the outside force has not been applied.

In one embodiment, the reduced contact surface area will increase to greater than 25% of the total surface area defined by outermost ridges 856a when a downward clamping pressure 870 of at least 0.5 Bar is applied to a portion of the object. In another embodiment, the surface area of ridge tops contacting the object is greater than 50% of the total surface area, and in another embodiment greater that 75% of the contact surface area when the 0.5 Bar downward clamping pressure 870 is applied to the object. In another embodiment, the surface areas on the ridge tops contacting the object will increase by at least a factor of 10 when a downward clamping force of 0.5 Bar is applied to the object. Thus, for example, an initial contact surface area of 2% within the defined area of outermost ridges will increase to a contact surface area of at least 20% after the application of a 0.5 Bar force is applied. It should be noted that the 0.5 Bar clamping force is exemplary only and is used simply as an example test point for characterizing one aspect of the present disclosure. In practice of actually clamping a wafer to a table, other clamping forces can of course be used. In addition, in referring to the 0.5 Bar clamping force as a test case, this force can be considered to be the total force applied by the object against the ridge tops (which includes any gravitational force between the ridge tops and the object 850). Further, in calculating the contact surface area for the above test points, this should be conducted linearly along a plane generally defined by the outermost ridge tops that contact the object and should not include the complex surface area within the furrows of the burl.

Figure 9:
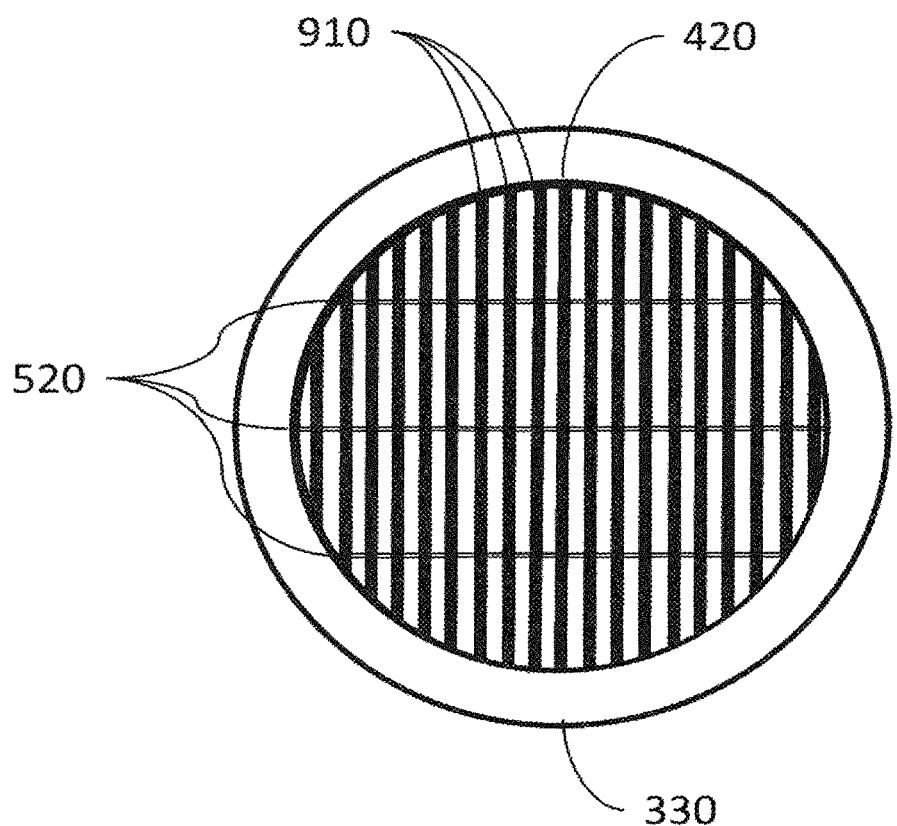
FIG. 9 is a simplified top view of a burl having several exemplary ridges formed across hilltops on the burl surface, according to an embodiment.

FIG. 9 is a simplified top view of a burl having several exemplary ridges 520 formed across hilltops 910 on the burl surface, according to an embodiment. Some embodiments can include burls 330 that have "hilltop" structures, which can be raised areas on the burl surface. The embodiment illustrated in FIG. 9 shows burl 330 that includes hilltop 910, with furrows and ridges 520 formed across hilltop 910 at an oblique angle. The oblique angle can be approximately 90 degrees or substantially perpendicular to the hilltops 910.

Figure 10:
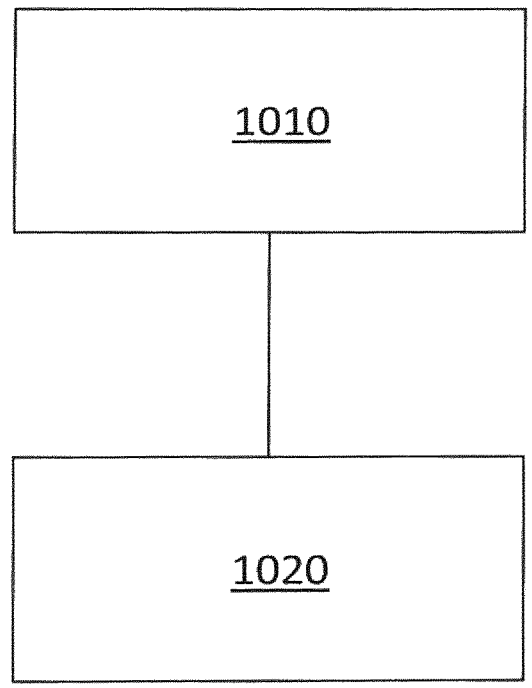
FIG. 10 is a process flow diagram for controlling a tool to form furrows and ridges, according to an embodiment.

FIG. 10 is a process flow diagram for controlling a tool to form furrows and ridges, according to an embodiment.

The methods described herein, as well as computer implemented processes for controlling a tool, can include, at 1010, receiving, at a control computer, instructions for a tool configured to modify the surface.

At 1020, forming, in a deterministic manner based on the instructions received at the control computer, a modified surface having a furrow and a ridge, where the ridge reduces the sticking by reducing a contact surface area of the modified surface.

Forming ridges and furrows, as described herein, can be done with precise and predefined control of a tool or other device that creates the furrows to specified dimensions and in a specified pattern. In an embodiment, part of such a method can include acquiring images of the surface from an imaging device, registering the tool tip in a coordinate space of the surface based on the images, and controlling the tool to move the tool tip to predefined coordinates in the coordinate space to create the furrow and the ridge. Such embodiments can be similar to a computer-aided manufacturing (CAM) process where, through automatic or user-supplied instructions, the ridges are formed by movement of the tool tip on the surface.

An imaging device can include, for example, a camera, microscope, sensor, etc. In other implementations, registration of the tool tip can be performed by mechanical means, such as stops or set points of a stage that allows movement of the surface to be modified relative to the tool tip.

In some embodiments, the tool tip can be controlled to have a horizontal resolution of 1 micron or less and a vertical resolution of 10 nanometers or less. Similarly, the resolution of the delivered force by the tool tip can be 1 mili-Newton or less.

Based on the instructions received at the control computer, the tool tip can be controlled to form the modified surface having parallel ridges. Another embodiment can include controlling the tool tip to form the modified surface having a non-uniform density of ridges that corresponds to a non-uniform burl load. The term "burl load" means the weight (or pressure) applied to a given burl. For example, if a wafer is clamped about the edges, then the burl load may be higher at the edges of a wafer than at the center. In such cases, the ridges, in some locations, may be desired to be thicker or more densely placed to support the increased pressure.

Figure 11:
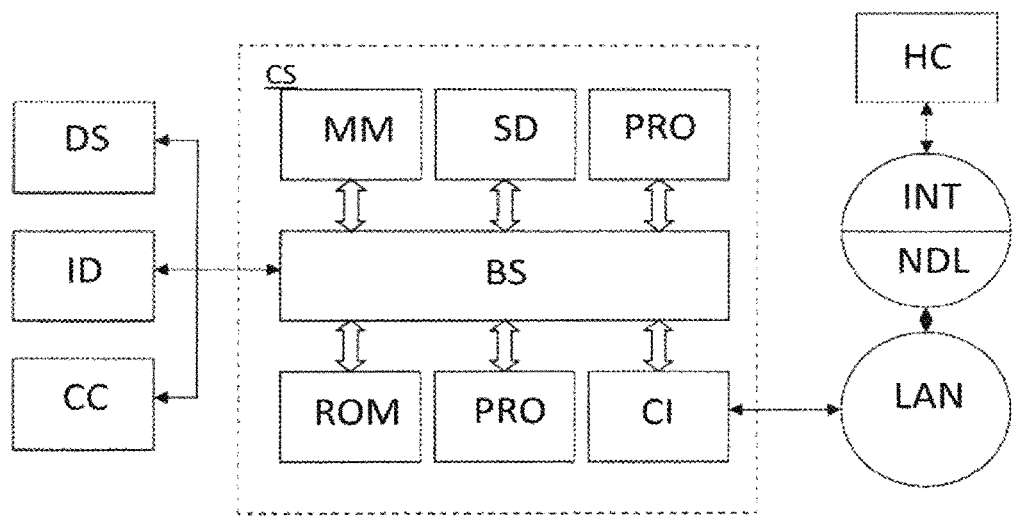
FIG. 11 is a block diagram of an example computer system, according to an embodiment.

FIG. 11 is a block diagram of an example computer system CS, according to an embodiment.

Computer system CS includes a bus BS or other communication mechanism for communicating information, and a processor PRO (or multiple processor) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions to be executed by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions contained in main memory MM causes processor PRO to perform the process steps described herein. One or more processors in a multi-processing arrangement may also be employed to execute the sequences of instructions contained in main memory MM. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the features described herein. Transitory computer-readable media can include a carrier wave or other propagating electromagnetic signal.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) both use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 12:
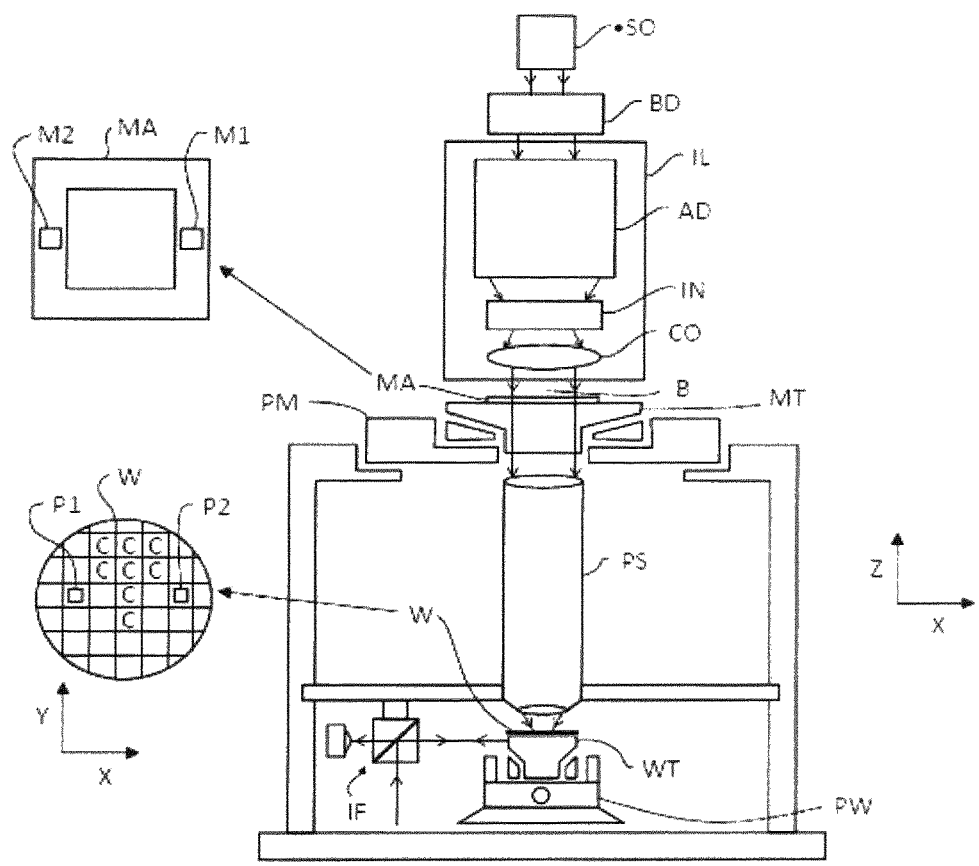
FIG. 12 is a schematic diagram of a lithographic projection apparatus, according to an embodiment.

FIG. 12 is a schematic diagram of a lithographic projection apparatus, according to an embodiment.

The lithographic projection apparatus can include an illumination system IL, a first object table MT, a second object table WT, and a projection system PS.

Illumination system IL, can condition a beam B of radiation. In this particular case, the illumination system also comprises a radiation source SO.

First object table (e.g., patterning device table) MT can be provided with a patterning device holder to hold a patterning device MA (e.g., a reticle), and connected to a first positioner to accurately position the patterning device with respect to item PS.

Second object table (substrate table) WT can be provided with a substrate holder to hold a substrate W (e.g., a resist-coated silicon wafer), and connected to a second positioner to accurately position the substrate with respect to item PS.

Projection system ("lens") PS (e.g., a refractive, catoptric or catadioptric optical system) can image an irradiated portion of the patterning device MA onto a target portion C (e.g., comprising one or more dies) of the substrate W.

As depicted herein, the apparatus can be of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning apparatuses, such as a beam expander Ex, for example. The illuminator IL may comprise adjusting device AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

In some embodiments, source SO may be within the housing of the lithographic projection apparatus (as is often the case when source SO is a mercury lamp, for example), but that it may also be remote from the lithographic projection apparatus, the radiation beam that it produces being led into the apparatus (e.g., with the aid of suitable directing mirrors); this latter scenario can be the case when source SO is an excimer laser (e.g., based on KrF, ArF or F2 lasing).

The beam PB can subsequently intercept patterning device MA, which is held on a patterning device table MT. Having traversed patterning device MA, the beam B can pass through the lens PL, which focuses beam B onto target portion C of substrate W. With the aid of the second positioning apparatus (and interferometric measuring apparatus IF), the substrate table WT can be moved accurately, e.g. so as to position different target portions C in the path of beam PB. Similarly, the first positioning apparatus can be used to accurately position patterning device MA with respect to the path of beam B, e.g., after mechanical retrieval of the patterning device MA from a patterning device library, or during a scan. In general, movement of the object tables MT, WT can be realized with the aid of a long-stroke module (coarse positioning) and a short-stroke module (fine positioning). However, in the case of a stepper (as opposed to a step-and-scan tool) patterning device table MT may just be connected to a short stroke actuator, or may be fixed.

The depicted tool can be used in two different modes, step mode and scan mode. In step mode, patterning device table MT is kept essentially stationary, and an entire patterning device image is projected in one go (i.e., a single "flash") onto a target portion C. Substrate table WT can be shifted in the x and/or y directions so that a different target portion C can be irradiated by beam PB.

In scan mode, essentially the same scenario applies, except that a given target portion C is not exposed in a single "flash." Instead, patterning device table MT is movable in a given direction (the so-called "scan direction", e.g., the y direction) with a speed v, so that projection beam B is caused to scan over a patterning device image; concurrently, substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

Figure 13:
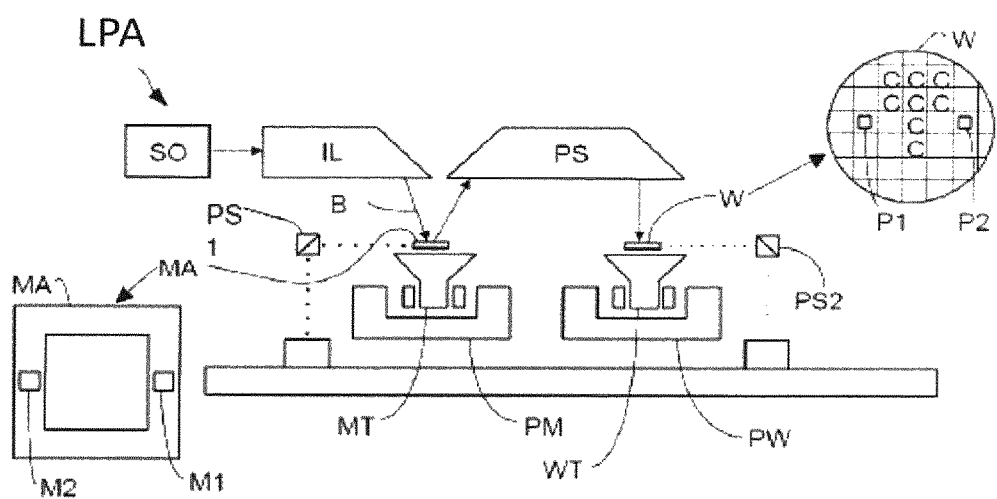
FIG. 13 is a schematic diagram of another lithographic projection apparatus, according to an embodiment.

FIG. 13 is a schematic diagram of another lithographic projection apparatus (LPA), according to an embodiment.

LPA can include source collector module SO, illumination system (illuminator) IL configured to condition a radiation beam B (e.g. EUV radiation), support structure MT, substrate table WT, and projection system PS.

Support structure (e.g. a patterning device table) MT can be constructed to support a patterning device (e.g. a mask or a reticle) MA and connected to a first positioner PM configured to accurately position the patterning device;

Substrate table (e.g. a wafer table) WT can be constructed to hold a substrate (e.g. a resist coated wafer) W and connected to a second positioner PW configured to accurately position the substrate.

Projection system (e.g. a reflective projection system) PS can be configured to project a pattern imparted to the radiation beam B by patterning device MA onto a target portion C (e.g. comprising one or more dies) of the substrate W.

As here depicted, LPA can be of a reflective type (e.g. employing a reflective patterning device). It is to be noted that because most materials are absorptive within the EUV wavelength range, the patterning device may have multi-layer reflectors comprising, for example, a multi-stack of molybdenum and silicon. In one example, the multi-stack reflector has a 40 layer pairs of molybdenum and silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Illuminator IL can receive an extreme ultra violet radiation beam from source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. Source collector module SO may be part of an EUV radiation system including a laser for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser may not be considered to form part of the lithographic apparatus and the radiation beam can be passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

Illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B can be incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LPA could be used in at least one of the following modes, step mode, scan mode, and stationary mode.

In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

In scan mode, the support structure (e.g. patterning device table) MT and the substrate table WT are scanned synchronously while a pattern imparted to the radiation beam is projected onto target portion C (i.e. a single dynamic exposure). The velocity and direction of substrate table WT relative to the support structure (e.g. patterning device table) MT may be determined by the (de-)magnification and image reversal characteristics of the projection system PS.

In stationary mode, the support structure (e.g. patterning device table) MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array.

Figure 14:
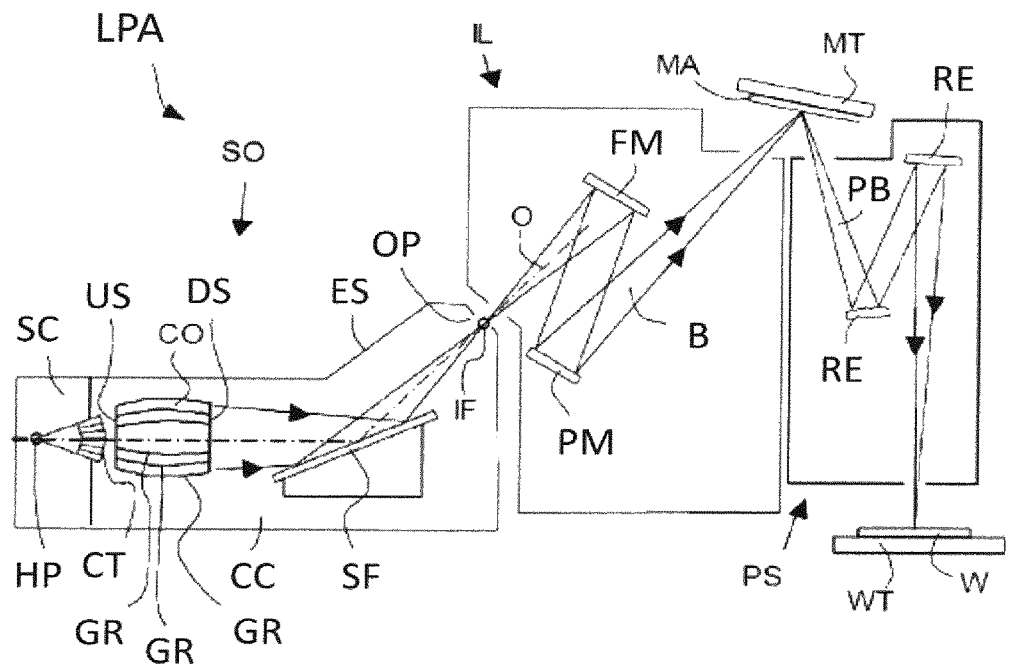
FIG. 14 is a detailed view of the lithographic projection apparatus, according to an embodiment.

FIG. 14 is a detailed view of the lithographic projection apparatus, according to an embodiment.

As shown, LPA can include the source collector module SO, the illumination system IL, and the projection system PS. The source collector module SO is constructed and arranged such that a vacuum environment can be maintained in an enclosing structure ES of the source collector module SO. An EUV radiation emitting hot plasma HP may be formed by a discharge produced plasma source. EUV radiation may be produced by a gas or vapor, for example Xe gas, Li vapor or Sn vapor in which the hot plasma HP is created to emit radiation in the EUV range of the electromagnetic spectrum. The hot plasma HP is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma HP is passed from a source chamber SC into a collector chamber CC via an optional gas barrier or contaminant trap CT (in some cases also referred to as contaminant barrier or foil trap) which is positioned in or behind an opening in source chamber SC. The contaminant trap CT may include a channel structure. Contamination trap CT may also include a gas barrier or a combination of a gas barrier and a channel structure. The contaminant trap or contaminant barrier CT further indicated herein at least includes a channel structure, as known in the art.

The collector chamber CC may include a radiation collector CO which may be a so-called grazing incidence collector. Radiation collector CO has an upstream radiation collector side US and a downstream radiation collector side DS. Radiation that traverses radiation collector CO can be reflected off a grating spectral filter SF to be focused in a virtual source point IF along the optical axis indicated by the dot-dashed line 'O'. The virtual source point IF can be referred to as the intermediate focus, and the source collector module can be arranged such that the intermediate focus IF is located at or near an opening OP in the enclosing structure ES. The virtual source point IF is an image of the radiation emitting plasma HP.

Subsequently the radiation traverses the illumination system IL, which may include a facetted field mirror device FM and a facetted pupil mirror device pm arranged to provide a desired angular distribution of the radiation beam B, at the patterning device MA, as well as a desired uniformity of radiation amplitude at the patterning device MA. Upon reflection of the beam of radiation B at the patterning device MA, held by the support structure MT, a patterned beam PB is formed and the patterned beam PB is imaged by the projection system PS via reflective elements RE onto a substrate W held by the substrate table WT.

More elements than shown may generally be present in illumination optics unit IL and projection system PS. The grating spectral filter SF may optionally be present, depending upon the type of lithographic apparatus. Further, there may be more mirrors present than those shown in the figures, for example there may be 1-6 additional reflective elements present in the projection system PS.

Collector optic CO can be a nested collector with grazing incidence reflectors GR, just as an example of a collector (or collector mirror). The grazing incidence reflectors GR are disposed axially symmetric around the optical axis O and a collector optic CO of this type may be used in combination with a discharge produced plasma source, often called a DPP source.

Figure 15:
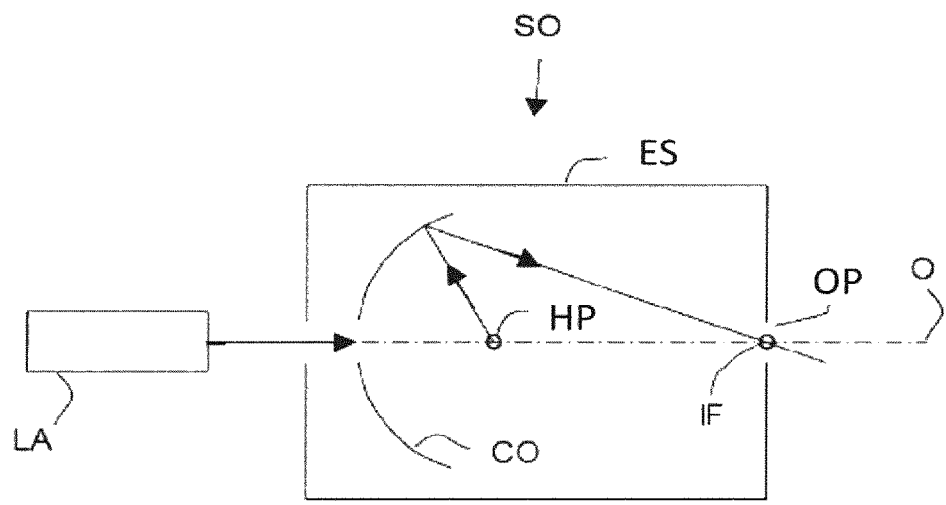
FIG. 15 is a detailed view of the source collector module of the lithographic projection apparatus, according to an embodiment.

FIG. 15 is a detailed view of source collector module SO of lithographic projection apparatus LPA, according to an embodiment.

Source collector module SO may be part of an LPA radiation system. A laser LA can be arranged to deposit laser energy into a fuel, such as xenon (Xe), tin (Sn) or lithium (Li), creating the highly ionized plasma HP with electron temperatures of several 10's of eV. The energetic radiation generated during de-excitation and recombination of these ions is emitted from the plasma, collected by a near normal incidence collector optic CO and focused onto the opening OP in the enclosing structure ES.

The embodiments may further be described using the following clauses:

1. A method for reducing sticking of an object to a surface used in a lithography process, the method comprising:
   receiving, at a control computer, instructions for a tool configured to modify the surface; and
   forming, in a deterministic manner based on the instructions received at the control computer, a modified surface having a furrow and a ridge, wherein the ridge reduces the sticking by reducing a contact surface area of the modified surface.

2. The method of clause 1, wherein the modified surface results from moving a tool tip of a tool causing a plastic deformation of the surface such that there is substantially no loss of material.

3. The method of clause 1, further comprising:
acquiring images of the surface from an imaging device;
registering a tool tip in a coordinate space of the surface based on the images; and
controlling the tool to move the tool tip to predefined coordinates in the coordinate space to create the furrow and the ridge.

4. The method of clause 3, wherein the controlling has a horizontal resolution of 1 micron or less and a vertical resolution of 10 nanometers or less, and wherein the resolution of the delivered force by the tool tip is 1 mili-Newton or less.

5. The method of clause 3, the controlling further comprising controlling the tool tip to form the modified surface having a plurality of parallel ridges.

6. The method of clause 3, the controlling further comprising controlling the tool tip to form the modified surface having a non-uniform density of ridges that corresponds to a non-uniform burl load.

7. The method of clause 1, wherein the surface is at between 15 and 40 degrees Celsius when forming the modified surface.

8. A computer program product comprising a non-transitory computer readable medium having instructions recorded thereon, the instructions when executed by a computer implementing the method of any of the above clauses.

9. An apparatus for use in a lithography process, the apparatus comprising:
a modified surface that comprises a plurality of furrows and ridges forming a reduced contact surface area to reduce a sticking of an object to the modified surface, wherein at least 60% of the plurality of ridges have a height variation of less than 100 nm.

10. The apparatus of clause 9, wherein the plurality of ridges have a ridge height that is measured from an average height of an unmodified surface.

11. The apparatus of clause 9, wherein at least 80% of the plurality of ridges have a height variation of less than 100 nm.

12. The apparatus of clause 11, wherein at least 60% of the plurality of ridges have a height variation of less than 10 nm.

13. The apparatus of clause 9, wherein at least 80% of the plurality of ridges have a height variation of less than 5 nm.

14. The apparatus of clause 9, wherein the height variation is measured over essentially all of the modified surface.

15. The apparatus of clause 9, further comprising a plurality of burls, the burls including the plurality of furrows and ridges on a corresponding plurality of burl surfaces.

16. The apparatus of clause 9, at least some of the plurality of burls having a coating, wherein the plurality of furrows and ridges are formed in the coating.

17. The apparatus of clause 9, wherein the plurality of furrows and ridges are parallel.

18. The apparatus of clause 9, further comprising a plurality of hilltops, wherein the plurality of furrows and ridges are formed across the hilltops.

19. The apparatus of clause 18, wherein the plurality of furrows and ridges are formed substantially perpendicular to the hilltops.

20. The apparatus of clause 9, wherein the modified surface is on a burl extending from a substrate.

21. The apparatus of clause 20, wherein the substrate is a reticle clamp, wafer clamp, or wafer table.

22. The apparatus of clause 20, wherein the burl further comprises a coating and the modified surface is on the coating.

23. The apparatus of clause 22, wherein the coating is a hard ceramic coating.

24. The apparatus of clause 9, wherein the surface is a burl surface made from a plurality of burls.

25. The apparatus of clause 20, wherein the burl includes a hilltop and the furrow and ridge are formed at an oblique angle to the hilltop.

26. The apparatus of clause 25, wherein the oblique angle is approximately 90 degrees.

27. The apparatus of clause 9, wherein the modified surface comprises the furrow and two ridges on either side of the furrow.

28. The apparatus of clause 9, wherein the furrow has a depth between 50 to 150 nm.

29. The apparatus of clause 9, wherein the furrow has a depth of approximately 100 nm.

30. The apparatus of clause 9, wherein the ridge has a height between 2 and 50 nm.

31. The apparatus of clause 9, wherein the ridge has a height of approximately 10 nm.

32. An apparatus comprising:
a modified surface that comprises a plurality of furrows and ridges forming a reduced contact surface area to reduce a sticking of an object to the modified surface, the plurality of ridges having an elastic property that causes the reduced contact surface area to increase when the plurality of ridges is elastically deformed.

33. The apparatus of clause 32, wherein the modified surface is formed from a plurality of plastic deformations of an unmodified surface.

34. The apparatus of clause 32, wherein the reduced contact surface area of the plurality of ridges is less than 5% of a total contact surface area when no deforming forces are applied to the plurality of ridges.

35. The apparatus of clause 32, the reduced contact surface area will increase to greater than 25% of the total surface area defined by outermost ridges when a downward clamping pressure of at least 0.5 Bar is applied to a portion of the object.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-50 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

The invention claimed is:

1. A wafer support comprising:
a plurality of burls disposed at a first surface of the wafer support, wherein each burl comprises a modified burl surface configure to contact and thereby support a wafer when disposed on the wafer support;

wherein each modified burl surface comprises a furrow and a plurality of ridges forming a reduced contact surface area to reduce a sticking of the wafer to the plurality of burls of the wafer support, the plurality of ridges having an elastic property that causes the reduced contact surface area to increase when the plurality of ridges is elastically deformed.

2. The wafer support of claim 1, wherein each modified burl surface is formed from a plurality of plastic deformations of an unmodified surface.

3. The wafer support of claim 1, wherein the reduced contact surface area of the plurality of ridges is less than 5% of a total contact surface area when no deforming forces are applied to the plurality of ridges.

4. The wafer support of claim 1, the reduced contact surface area will increase to greater than 25% of the total surface area defined by outermost ridges when a downward clamping pressure of at least 0.5 Bar is applied to a portion of the wafer.

5. The wafer support of claim 1, wherein the plurality of ridges have a ridge height that is measured from an average height of an unmodified surface.

6. The wafer support of claim 1, wherein at least 60% of the plurality of ridges have a height variation of less than 100 nm.

7. The wafer support of claim 6, wherein the height variation is measured over essentially all of the modified burl surfaces.

8. The wafer support of claim 1, wherein at least 80% of the plurality of ridges have a height variation of less than 100 nm.

9. The wafer support of claim 1, wherein at least 60% of the plurality of ridges have a height variation of less than 10 nm.

10. The wafer support of claim 1, wherein at least 80% of the plurality of ridges have a height variation of less than 5 nm.

11. The wafer support of claim 1, wherein at least some of the plurality of ridges are formed on a coating disposed on each burl.

12. The wafer support of claim 1, wherein the furrows and ridges are parallel.

13. The wafer support of claim 1, further comprising a plurality of hilltops, wherein the furrows and ridges are formed across the hilltops.

14. The wafer support of claim 13, wherein the furrows and ridges are formed substantially perpendicular to the hilltops.

* * * * *